United States Patent [19]

Meszlenyi

[11] Patent Number: 5,457,432

[45] Date of Patent: Oct. 10, 1995

[54] CURRENT CONTROLLED SCHMITT TRIGGER OSCILLATOR

[75] Inventor: Ivan Meszlenyi, North York, Canada

[73] Assignee: Powerpaq Industries Inc., Downsview, Canada

[21] Appl. No.: 297,014

[22] Filed: Aug. 29, 1994

[30] Foreign Application Priority Data

Aug. 27, 1993 [CA] Canada ................................. 2105041

[51] Int. Cl.$^6$ ............................................... H03K 3/0231
[52] U.S. Cl. ...................... 331/111; 331/143; 331/177 R
[58] Field of Search .................................. 331/111, 143, 331/177 R

[56] References Cited

U.S. PATENT DOCUMENTS 4,646,219  2/1987  Röhl ........................................... 363/21
5,345,196  9/1994  Mahant-Shetti et al. ............... 331/111

*Primary Examiner*—Siegfried H. Grimm
*Attorney, Agent, or Firm*—Sim & McBurney

[57] ABSTRACT

A current controlled oscillator includes an optocoupler driven by a control current; a diode bridge comprising four high speed diodes where the polarized input receives signals from an output transistor of the optocoupler; a resistor connected between the transistor output of the optocoupler and the polarized input of the diode bridge; an inverting Schmitt trigger having well defined low and high thresholds where the inverting input and an output are connected to a non-polarized input of the diode bridge; a timing resistor connected between the input and output of the Schmitt trigger; a timing capacitor connected between the negative input and ground of the Schmitt trigger; a pair of voltage references establishing the low and high thresholds of the inverting Schmitt trigger.

4 Claims, 5 Drawing Sheets

CURRENT CONTROLLED SCHMITT TRIGGER OSCILLATOR

FIELD OF THE INVENTION

The present invention relates in general to oscillators, and more particularly to the type of oscillator utilized in high frequency power converters where initial and final frequencies are required to be well defined.

BRIEF DESCRIPTION OF THE DRAWINGS

In drawings which illustrate the prior art and embodiments of the invention.

DESCRIPTION OF THE RELATED ART

Figure 1:
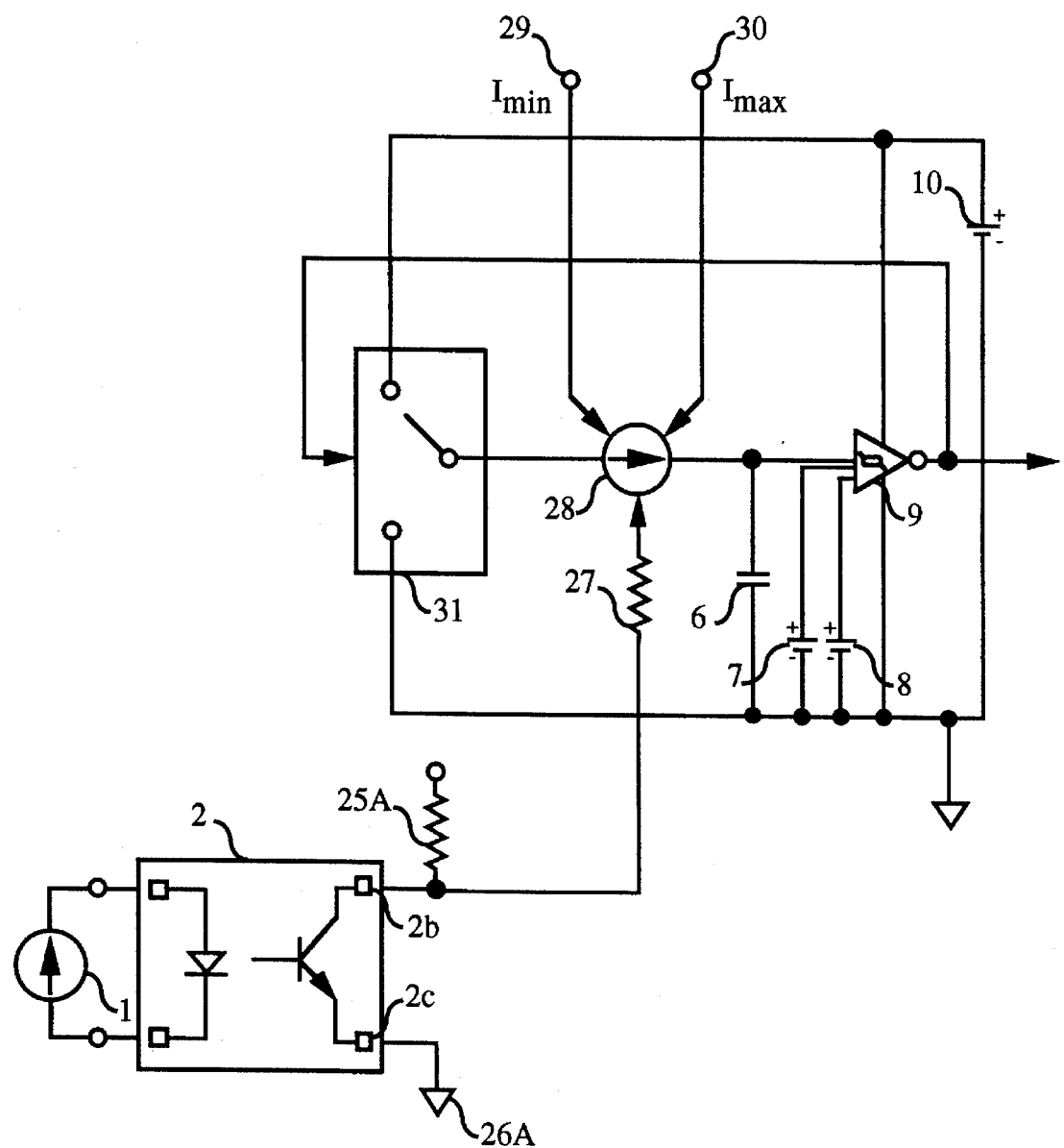
FIG. 1 is a drawing of a conventional current controlled oscillator circuit.

FIG. 1 is a drawing of the circuit of a conventional current controlled oscillator in a floating input configuration such as utilized in isolated off-line switch mode power supplies. In FIG. 1, optocoupler 2 is fed by control current 1. The collector 2b of the output transistor of optocoupler 2 is connected to pull-up resistor 25A and programming resistor 27. The emitter 2c of optocoupler 2 is connected to ground 26A. Programming resistor 27 is connected to current source 28 which is connected to current references 29($I_{min}$), and 30 ($I_{max}$). Switch 31 is connected to current source 28 and is driven by Schmitt trigger 9. Current source 28 is also connected to timing capacitor 6 and Schmitt trigger 9, which is connected to supply 10 and also to voltage references 7 and 8.

The operation of the current controlled oscillator is as follows. For a given amount of control current from current source 1, a voltage differential is established at the collector 2b of optocoupler 2. This voltage is then converted to a current level by programming resistor 27. This current level establishes the base frequency of the oscillation. Current source 28 is programmed by inputs 29 and 30 in order to obtain minimum and maximum current values for the charge-up and discharge of timing capacitor 6 connected to Schmitt trigger 9, which in turn determines the minimum and maximum values of the frequency of oscillation. With this programming arrangement, it is difficult to achieve high accuracies at both the initial and final frequency values. A tolerance of 10% accuracy in the initial and final frequencies is considered to be good for such prior art designs.

SUMMARY OF THE INVENTION

The present invention has been implemented with a view to resolving the limitations described above along with overcoming problems associated with accuracy of the initial and final frequency of a current controlled oscillator operating in a high frequency region, especially in applications where such qualities are of extreme importance, such as in switch mode power converters.

Another object of this invention is to provide an economical solution to these problems by constructing a current controlled oscillator which utilizes the optocoupler, already an integral component used to provide isolation in off-line power converters. Also, by using suitable components for the timing resistor and timing capacitor, accuracies of better than 1% can easily be attained.

DESCRIPTION OF THE PREFERRED EMBODIMENT

An embodiment of the present invention is described below with reference to the attached drawings.

Figure 2:
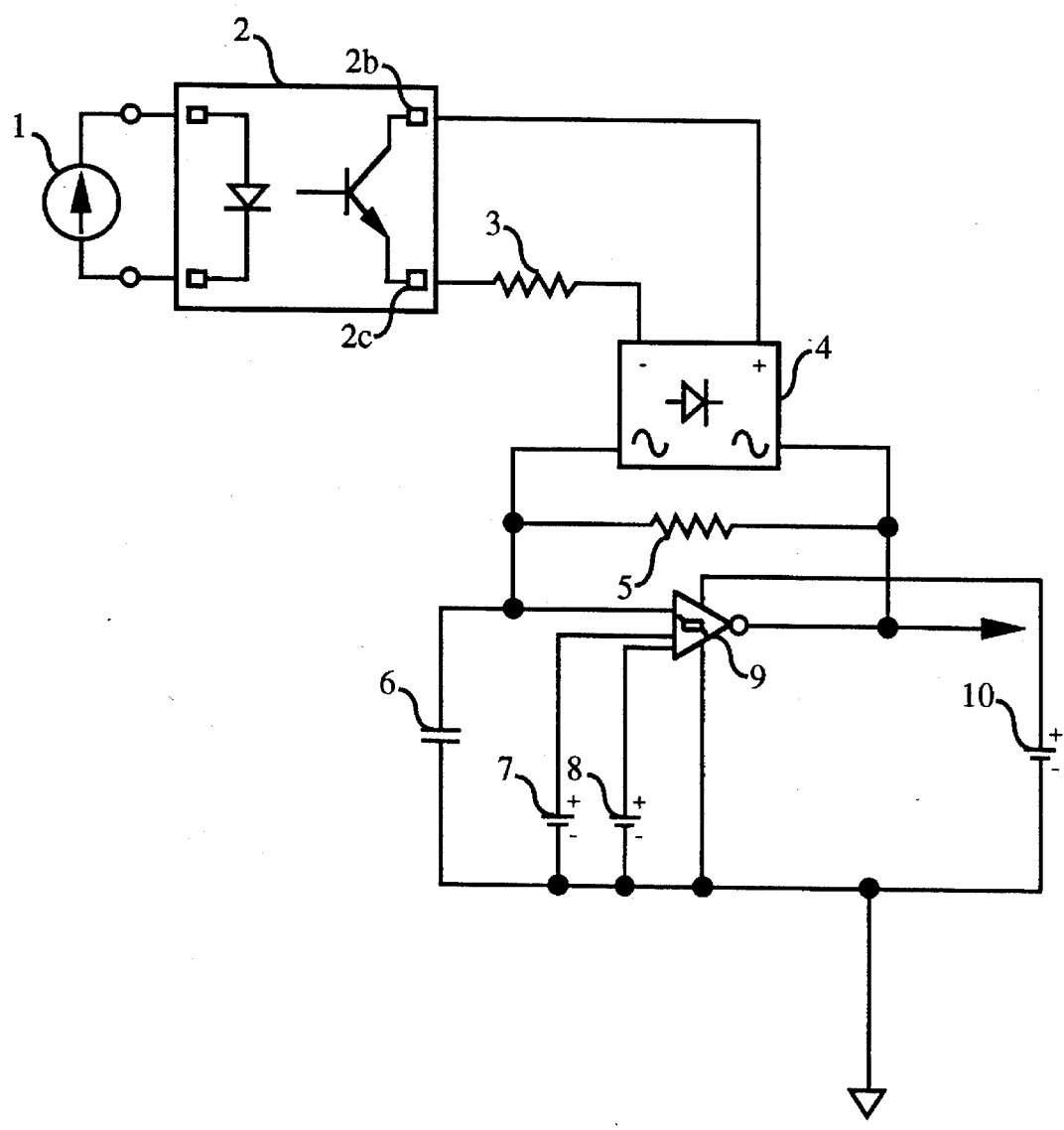
FIG. 2 is a drawing of a current controlled oscillator according to an embodiment of the present invention.

In FIG. 2, an optocoupler 2 comprises a diode input and a transistor output with collector 2b and emitter 2c. Control current 1 is connected to the input of optocoupler 2. Frequency limiting resistor 3 is connected to emitter 2c and also to the negative terminal of a diode bridge 4. Collector 2b is connected to the positive terminal of the diode bridge 4. The two AC signal inputs of diode bridge 4 are connected in parallel with timing resistor 5 which is in turn connected between the input and the output of Schmitt trigger 9. The diode bridge 4 preferably comprises four high speed diodes connected in a full bridge configuration, in the usual manner, with the polarized input to the bridge being connected to the output transistor of optocoupler 2. Schmitt trigger 9 is supplied with voltage references 7 and 8 which set the low and high threshold values, as discussed above with reference to FIG. 1. Timing capacitor 6 is connected from ground to the junction of timing resistor 5, the AC output of diode bridge 4 and the signal input of Schmitt trigger 9. Voltage supply 10 is connected between the supply input of Schmitt trigger 9 and ground.

The operation of the preferred embodiment illustrated in FIG. 2 is described below with reference to the waveforms of the oscillator shown in FIG. 4 and the current-to-frequency conversion transfer curve shown in FIG. 5.

Figure 4:
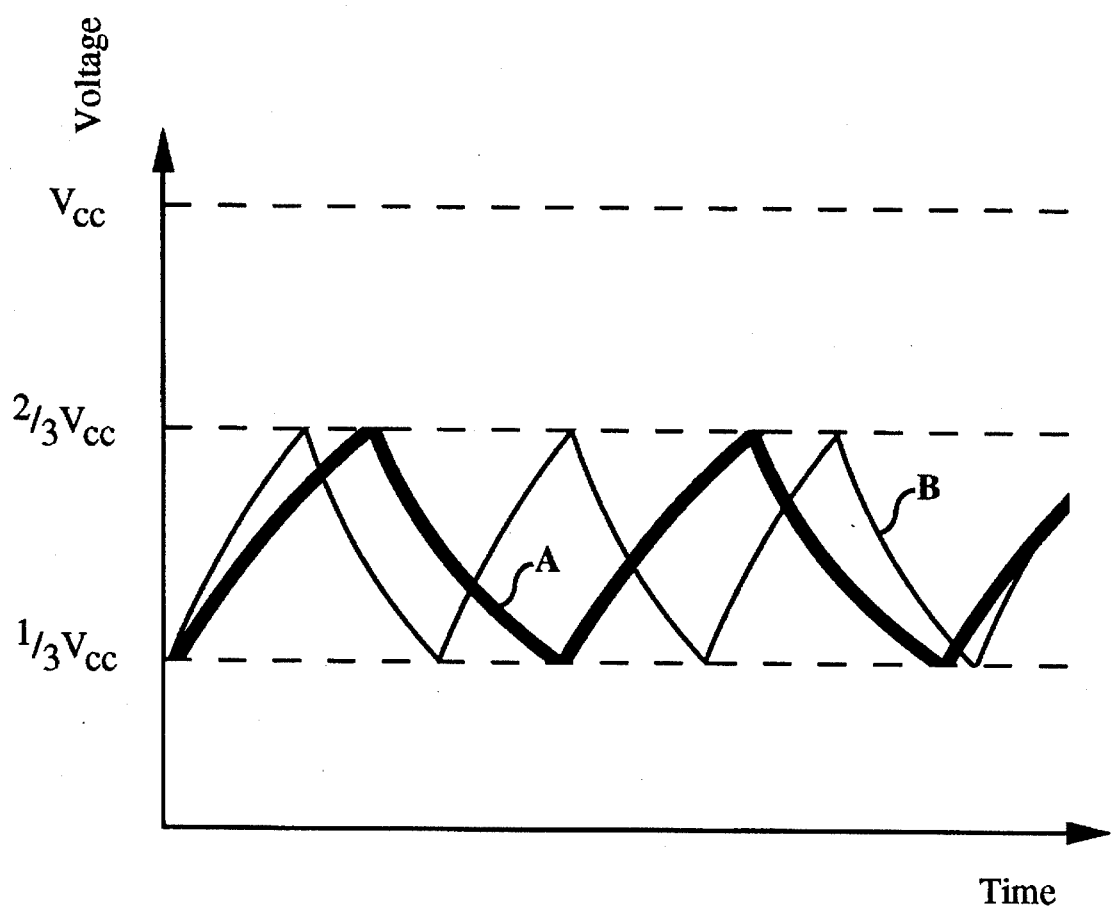
FIG. 4 is a drawing of the voltage waveform generated by the current controlled oscillator of the preferred embodiment.
Figure 5:
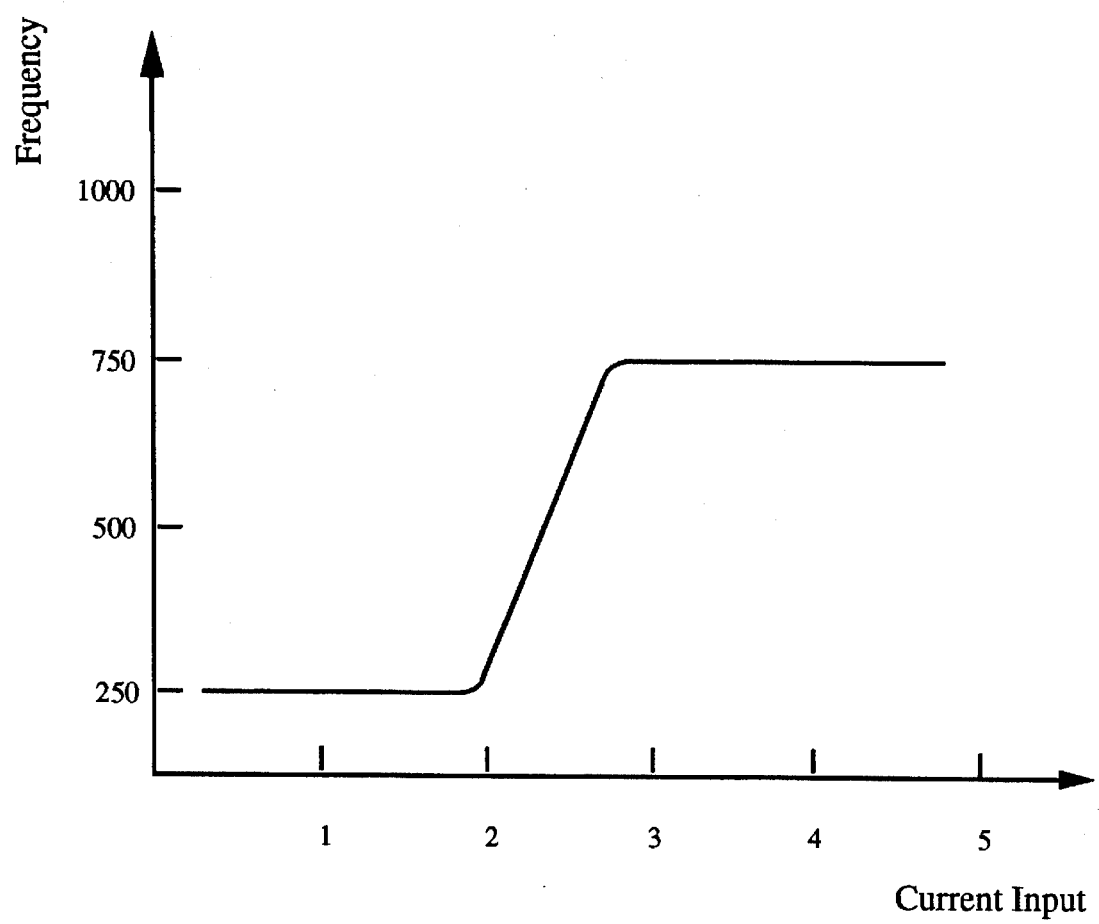
FIG. 5 is a drawing of the relationship between current and frequency of the current controlled oscillator in the preferred embodiment.

The threshold voltages of Schmitt trigger 9 are set up to be ⅓ and ⅔ of Vcc as shown in FIG. 4. This configuration achieves a 50% duty cycle output square wave and an output frequency which is proportional to that of the input control current as shown in FIG. 5.

A high precision oscillation can be maintained in the circuit of FIG. 2 with frequency established by timing resistor 5 and capacitor 6 before any current is injected into the control input of the optocoupler 2.

The continuous waveform A in FIG. 4 shows the voltage waveform on the timing capacitor 6 of Schmitt trigger 9 when there is zero control current 1 applied. Upon application of a control current 1 greater than zero current, the output transistor of optocoupler 2 turns on, and increases the bi-directional current flow to timing capacitor 6 through the diode bridge 4, which results in a faster charge-up and discharge rate for timing capacitor 6, as shown by waveform B in FIG. 4. Such an arrangement has, in very close approximation, the linearity features depicted in FIG. 5. It is apparent from the foregoing that several octaves of linear current-to-frequency transfer ratio may be thus obtained, which is more than satisfactory for applications in high frequency power converters, as described below with reference to FIG. 3.

Figure 3:
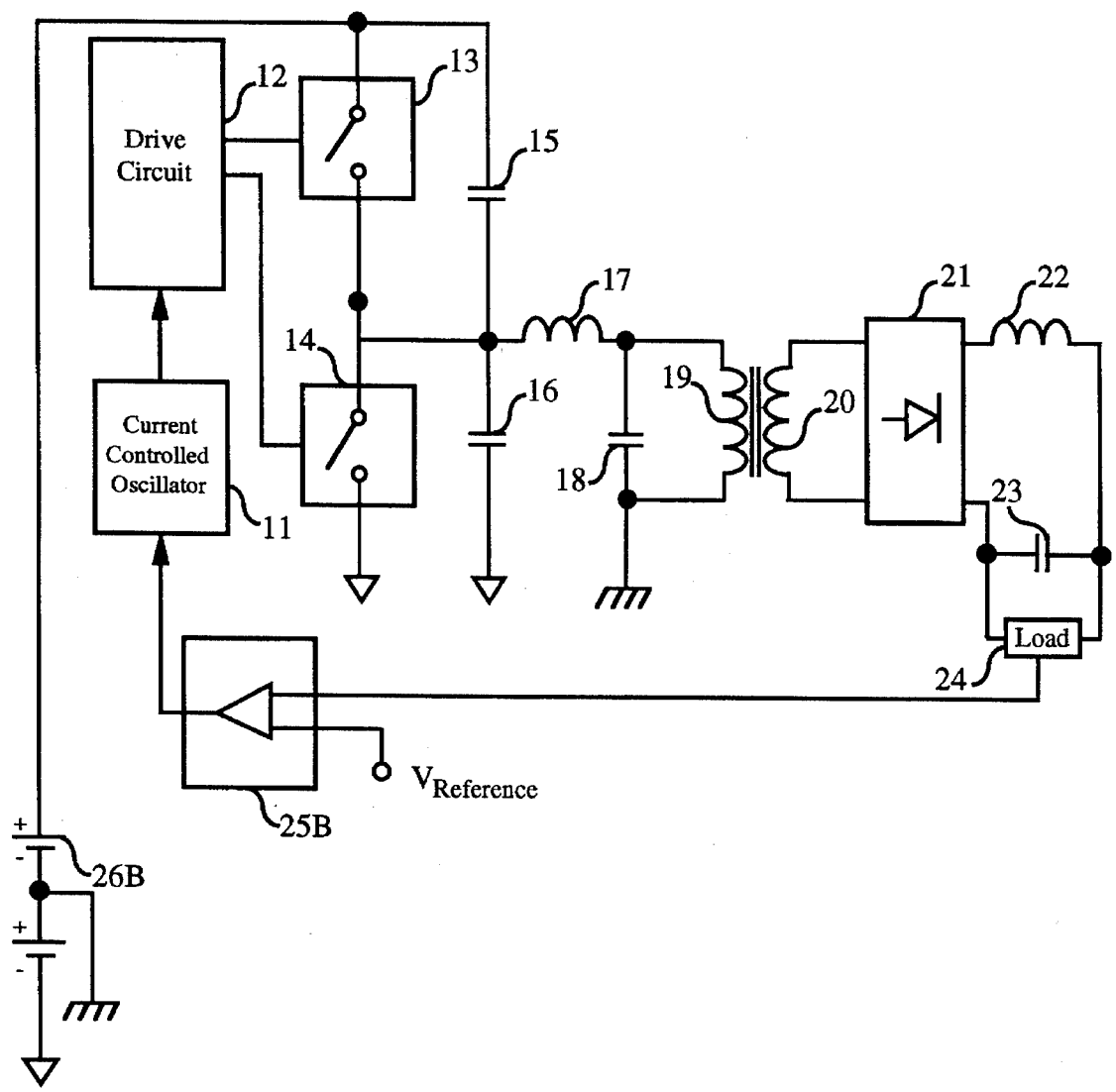
FIG. 3 is a drawing of a typical application of the present invention in a switch mode power supply.

FIG. 3 shows a typical application of the current controlled oscillator of the present invention where the current controlled oscillator is represented by reference numeral 11, and is connected in a feedback loop which is utilized to control the output voltage of a switch mode power supply. The topology shown in FIG. 3 requires a drive circuit 12 connected to first and second switching elements 13 and 14 which are connected in parallel respectively, to snubber capacitors 15 and 16. The junction of switching elements 13, 14 and capacitors 15, 16 drives a resonant tank comprised of inductor 17 and capacitor 18 to which the primary winding 19 of a transformer is connected in parallel. The secondary winding 20 is connected to a rectifier 21 which is in turn connected to an inductor 22 and an output filter capacitor 23, which in turn is connected in parallel to a load 24. Comparator 25B is connected to load 24 and completes the feedback loop for driving current controlled oscillator 11. A voltage source 26B has a positive terminal connected to switching element 13 and snubber capacitor 15, and a negative terminal connected to switching element 14 and snubber capacitor 16.

According to the present invention, the initial frequency of the current controlled oscillator 11 can be set with very high accuracy just above resonance of the power transfer curve of the resonant tank, comprising inductor 17 and capacitor 18, thereby assuring maximum power transfer for a given load 24. On the other hand, the ability of the current controlled oscillator of the present invention to achieve a well defined final frequency enables switching elements 13 and 14 to work in a zero voltage switching mode under high line light load conditions, even when several units of similar topology are connected in parallel.

Other modifications and variations of the invention are possible without departing from the sphere and scope as defined by the claims appended hereto.

I claim:

1. A current controlled oscillator circuit comprising:

a) control current means;

b) optocoupler means having an input driven by said control current means and an output;

c) diode bridge means having a polarized input for receiving signals from said output of said optocoupler means, and a non-polarized input;

d) inverting Schmitt trigger means having predetermined low and high voltage threshold levels, an inverting input and an output of said inverting Schmitt trigger means being connected to the non-polarized input of said diode bridge means;

e) timing resistor means connected between the inverting input and output of said Schmitt trigger means;

f) timing capacitor means connected between the inverting input of said Schmitt trigger means and ground; and g) pair of voltage references for establishing said low and high voltage threshold levels of said inverting Schmitt trigger means.

2. The current controlled oscillator of claim 1, including further resistor means connected between the output of said optocoupler means and the polarized input of said diode bridge means.

3. The current controlled oscillator circuit of claim 1, wherein said inverting Schmitt trigger means further includes a pair of threshold level setting inputs.

4. The current controlled oscillator circuit of claim 3, wherein said pair of voltage references are connected respectively to said pair of threshold level setting inputs of said inverting Schmitt trigger means.

* * * * *

UNITED STATES PATENT AND TRADEMARK OFFICE
CERTIFICATE OF CORRECTION

PATENT NO. : 5,457,432
DATED : OCTOBER 10, 1995
INVENTOR(S) : IVAN MESZLENYI

It is certified that error appears in the above-indentified patent and that said Letters Patent is hereby corrected as shown below:

On title page, item [73], should read as follows:
    -- ASSIGNEE: POWERPAQ TECHNOLOGIES INC.--

Signed and Sealed this

Ninth Day of July, 1996

*Attest:*

BRUCE LEHMAN

*Attesting Officer*     *Commissioner of Patents and Trademarks*